United States Patent
Böhm et al.

(10) Patent No.: US 11,177,652 B2
(45) Date of Patent: Nov. 16, 2021

(54) CIRCUIT ASSEMBLY FOR PROTECTING A UNIT TO BE OPERATED FROM A SUPPLY NETWORK AGAINST SURGES

(71) Applicant: DEHN + SÖHNE GMBH + CO. KG, Neumarkt/Opf. (DE)

(72) Inventors: Thomas Böhm, Hohenfels (DE); Franz Schork, Nuremberg (DE)

(73) Assignee: DEHN SE + CO. KG, Neumarkt/Opf. (DE)

( * ) Notice: Subject to any disclaimer, the term of this patent is extended or adjusted under 35 U.S.C. 154(b) by 164 days.

(21) Appl. No.: 15/746,103

(22) PCT Filed: Mar. 11, 2016

(86) PCT No.: PCT/EP2016/055224
§ 371 (c)(1),
(2) Date: Jan. 19, 2018

(87) PCT Pub. No.: WO2017/025202
PCT Pub. Date: Feb. 16, 2017

(65) Prior Publication Data
US 2018/0226791 A1   Aug. 9, 2018

(30) Foreign Application Priority Data

Aug. 7, 2015 (DE) ...................... 10 2015 010 308.3
Feb. 12, 2016 (DE) ...................... 10 2016 001 689.2

(51) Int. Cl.
*H02H 9/04* (2006.01)
*H01L 27/02* (2006.01)
(Continued)

(52) U.S. Cl.
CPC ......... *H02H 9/041* (2013.01); *H01L 27/0248* (2013.01); *H01L 27/0255* (2013.01);
(Continued)

(58) Field of Classification Search
CPC .......... H01L 27/0248–0296; H02H 9/04–046; H02H 9/041
See application file for complete search history.

(56) References Cited

U.S. PATENT DOCUMENTS

| 5,212,619 A | 5/1993 | Baudelot et al. ............ 361/91.8 |
| 5,379,178 A * | 1/1995 | Graf ........................ F02D 41/20 |
| | | 123/490 |

(Continued)

FOREIGN PATENT DOCUMENTS

| DE | 10338921 A1 | 3/2005 | ............... H02H 9/04 |
| DE | 102009022832 A1 | 4/2010 | ............... H02H 9/04 |

(Continued)

OTHER PUBLICATIONS

Notification Concerning Transmittal of International Preliminary Report on Patentability (Chapter I of the Patent Cooperation Treaty), in English, dated Feb. 22, 2018, which was issued by the International Bureau of WIPO in Applicant's corresponding international PCT application having Serial No. PCT/EP2016/055224, filed on Mar. 11, 2016.

(Continued)

*Primary Examiner* — Jared Fureman
*Assistant Examiner* — Christopher J Clark
(74) *Attorney, Agent, or Firm* — Bodner & O'Rourke, LLP; Gerald T. Bodner; Christian P. Bodner

(57) ABSTRACT

Circuit assembly for protecting a unit to be operated from a supply network against surges, comprising an input having a first and a second input connection, which are connected to the supply network, an output to which the unit to be protected can be connected, and a protective circuit which is placed between the first and the second input connections in order to limit the voltage applied thereto, said protective circuit comprising a power semiconductor device. The power semiconductor device includes at least one Zener (Continued)

Figure 1:
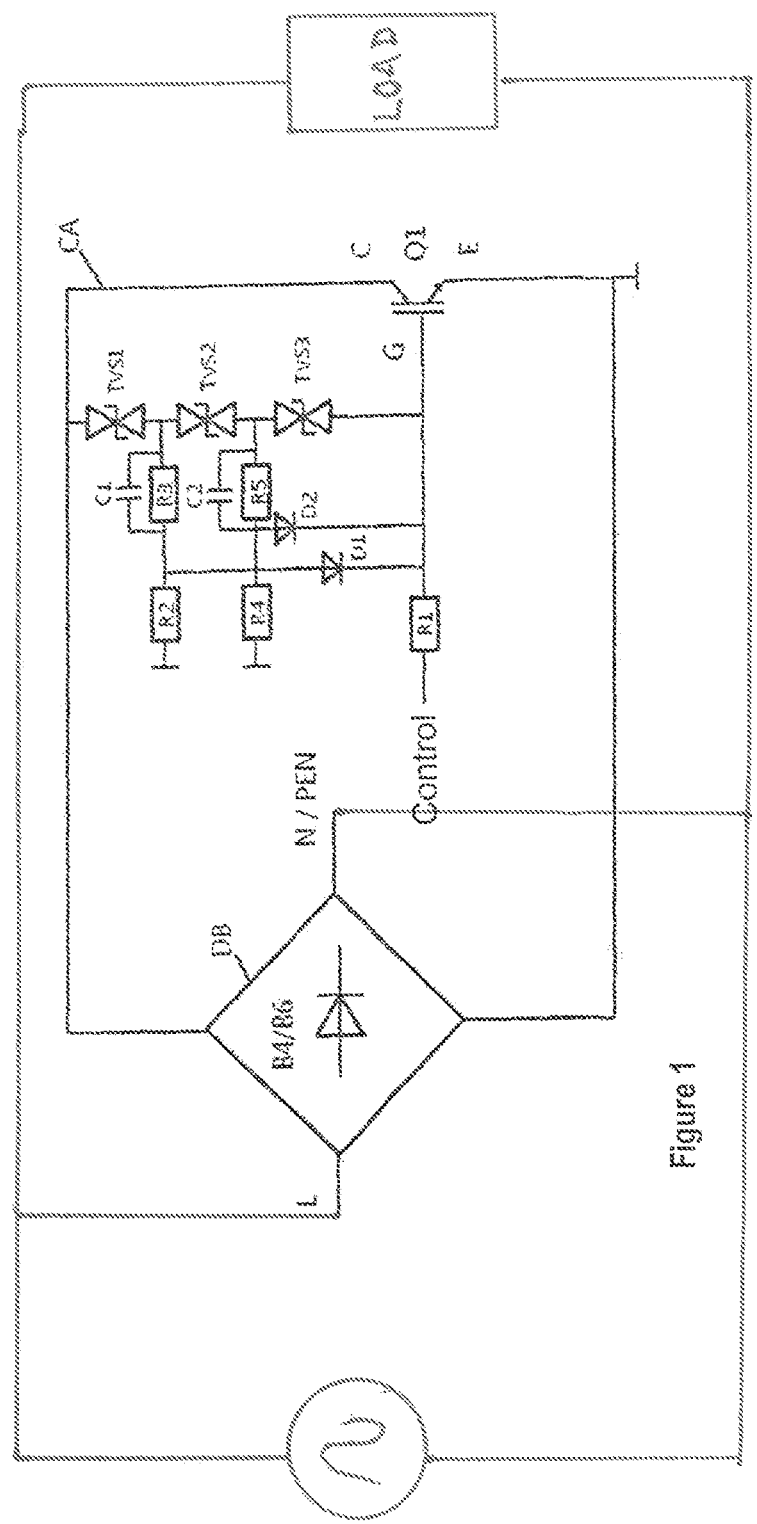

element between the collector and the gate, or a digital-to-analog converter is placed between the collector and the gate of the power semiconductor device. The protective level of this type of protective circuit can be easily adjusted by setting the clamping voltage for the power semiconductor device.

9 Claims, 3 Drawing Sheets

(51) Int. Cl.
  *H03K 5/08* (2006.01)
  *H02M 1/08* (2006.01)
(52) U.S. Cl.
  CPC ............... *H02H 9/04* (2013.01); *H02M 1/08* (2013.01); *H03K 5/08* (2013.01)

(56) References Cited

U.S. PATENT DOCUMENTS

| | | | |
|---|---|---|---|
| 8,724,276 B2 | 5/2014 | Igl et al. | 361/91.1 |
| 10,511,165 B2* | 12/2019 | Schork | H01L 27/0248 |
| 2005/0041356 A1 | 2/2005 | Storm et al. | 361/118 |
| 2006/0214704 A1* | 9/2006 | Nakano | H03K 5/08 |
| | | | 327/110 |
| 2011/0188162 A1 | 8/2011 | Wetter et al. | 361/57 |
| 2017/0325306 A1* | 11/2017 | Mishra | H05B 45/10 |

FOREIGN PATENT DOCUMENTS

| | | | |
|---|---|---|---|
| DE | 102010054402 A1 | 6/2012 | ............ H03K 17/06 |
| EP | 0397017 A2 | 11/1990 | ............... G05F 1/10 |
| EP | 0431215 A1 | 6/1991 | .......... H03K 17/082 |
| EP | 1508950 A2 | 2/2005 | ............... H02H 9/04 |
| EP | 2413502 A2 | 2/2012 | .......... H03K 17/081 |
| EP | 2340593 B1 | 7/2014 | ............... H02H 3/44 |

OTHER PUBLICATIONS

English translation of the International Preliminary Report on Patentability (Chapter I of the Patent Cooperation Treaty), dated Feb. 13, 2018, which was issued by the International Bureau of WIPO in Applicant's corresponding international PCT application having Serial No. PCT/EP2016/055224, filed on Mar. 11, 2016.

Written Opinion of the International Searching Authority, in English, dated Jul. 7, 2016, which was issued by the International Bureau of WIPO in Applicant's corresponding international PCT application having Serial No. PCT/EP2016/055224, filed on Mar. 11, 2016.

International Search Report, in English, dated Jul. 7, 2016, which was issued by the International Bureau of WIPO in Applicant's corresponding international PCT application having Serial No. PCT/EP2016/055224, filed on Mar. 11, 2016.

* cited by examiner

CIRCUIT ASSEMBLY FOR PROTECTING A UNIT TO BE OPERATED FROM A SUPPLY NETWORK AGAINST SURGES

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

(1) Field of the Invention

The invention relates to a circuit assembly for protecting a unit to be operated from a supply network against surges, comprising an input having a first and a second input connection, which are connected to the supply network, and an output to which the unit to be protected can be connected, and a protective circuit placed between the first and the second input connections in order to limit the voltage applied thereto, said protective circuit comprising a power semiconductor, according to the teaching of the coordinated claims 1, 2, 3 and 5.

(2) Description of Related Art

From EP 0 431 215 A1, a method and an arrangement for protecting a disconnectable thyristor against inadmissible overvoltage are already known. According to the teaching there, the anode voltage of the disconnectable thyristor is monitored with respect to its cathode voltage and a control signal is generated when a predetermined threshold value is exceeded, whereby the negative voltage source turned on at the gate of the disconnectable thyristor is turned off and the thyristor turned on by means of a turn-on circuit.

DE 103 38 921 A1 shows a circuit arrangement for protecting against surge voltages. The task there is based on the problem of protecting devices against surge voltages generated e.g. by lightning strikes on a voltage supply. The protective circuit provided comprises a switch arrangement apart from a limiter device. The switch arrangement comprises a switching element and a drive circuit for the switching element, wherein the switching element, in order to ensure a sufficiently precise dimensioning, is formed as a semiconductor element. The switch arrangement and the limiter device are connected in series and configured such that, when a predeterminable first trigger criterion is met, the switch arrangement will be conducting and will be blocked at a second trigger criterion.

From DE 10 2010 054 402 A1, a circuit for protecting an electric load from overvoltages is already known, wherein a second Zener diode is connected in series to a shunt controller in order to increase the limiting voltage. The second Zener diode increases the typical reference voltage by its breakdown voltage.

As to the prior art, reference should further be made to EP 2 340 593 B1 which discloses a multistage overvoltage protection circuit capable of adapting itself automatically to the applied operating voltage. When the operating voltage is exceeded in an inadmissible manner, a limiting of the voltage level is performed. In the solution already known in this respect, a transistor present there will be turned on in dependence on the slope via a high-pass when a transient overvoltage exists. For this purpose, a series resistance is required to generate a corresponding voltage drop for controlling the transistor.

BRIEF SUMMARY OF THE INVENTION

From the aforementioned, it is therefore a task of the invention to propose a further developed circuit assembly for protecting a unit to be operated from a supply network against overvoltages, said circuit assembly being capable of enabling the protective level to be adapted in a simple way both in a stepped and stepless and in a passive or active manner on the basis of a protective circuit including power semiconductors and a respective clamping operation of the power semiconductor.

The solution of the task is realized respectively by the features of the coordinated claims 1, 2, 3 and 5, the dependent claims including at least appropriate configurations and further developments.

The inventive teaching is based on the fact that the respective protective level can be defined by varying the Zener voltage of a clamping element known as such, in a power semiconductor, in particular an IGBT, which is used as an overvoltage limiting element.

According to a first embodiment, the protective circuit comprises a power semiconductor, wherein between the collector and the gate of the power semiconductor, at least one Zener element, e.g. a TVS diode, is connected, the Zener voltage yielding a clamping voltage for the power semiconductor. According to the invention, a plurality of Zener elements is connected in series in this embodiment, wherein, depending on the instantaneous value of the voltage of the supply network, at least one of the Zener elements enters the conducting state and thus the protective level is allowed to be automatically adapted.

In case of an overvoltage having a slope exceeding the set response slope, the voltage across the resistor R2 will increase and the power semiconductor IGBT actuated. The explained embodiment represents a combination of a slope-dependent response with a static protective level adaptation.

In a second embodiment of the invention, the Zener element is an integral part of a linear regulator connected between the gate and collector of the power semiconductor and following the voltage of the supply network so as to maintain the protective level on the voltage level of the supply voltage.

In the voltage regulator, inertia in terms of a dead time is implemented in a targeted way in order to block a signal adaptation in case of fast transient overvoltages. Instead, current flows toward the gate of the power semiconductor and drives the same.

In a third embodiment of the invention, a group of further Zener elements that can be connected in parallel to the Zener element is provided, which can be actuated by a driver unit. The driver unit is in each case in connection with the input of a transistor switch to which in each case one of the further Zener elements is associated on the output side.

In this embodiment, the driver unit is controlled by a microcontroller which determines the instantaneous value of the voltage of the supply network and controls or actuates the respective appropriate transistor switch via the driver unit to adapt the protective level.

In the fourth embodiment of the inventive teaching the protective circuit likewise comprises a power semiconductor, wherein, between the collector and the gate of the power semiconductor, a digital-to-analog converter is placed, the digital input thereof being in connection with the output of a microcontroller. At the microcontroller, a connection to the supply network is created on the input side, wherein the protective level of the circuit can be defined via the analog output of the digital-to-analog converter.

The invention will be explained below in more detail based on exemplary embodiments and with reference to Figures.

Shown are in:

BRIEF DESCRIPTION OF THE SEVERAL VIEWS OF THE DRAWINGS(S)

Figure 2:
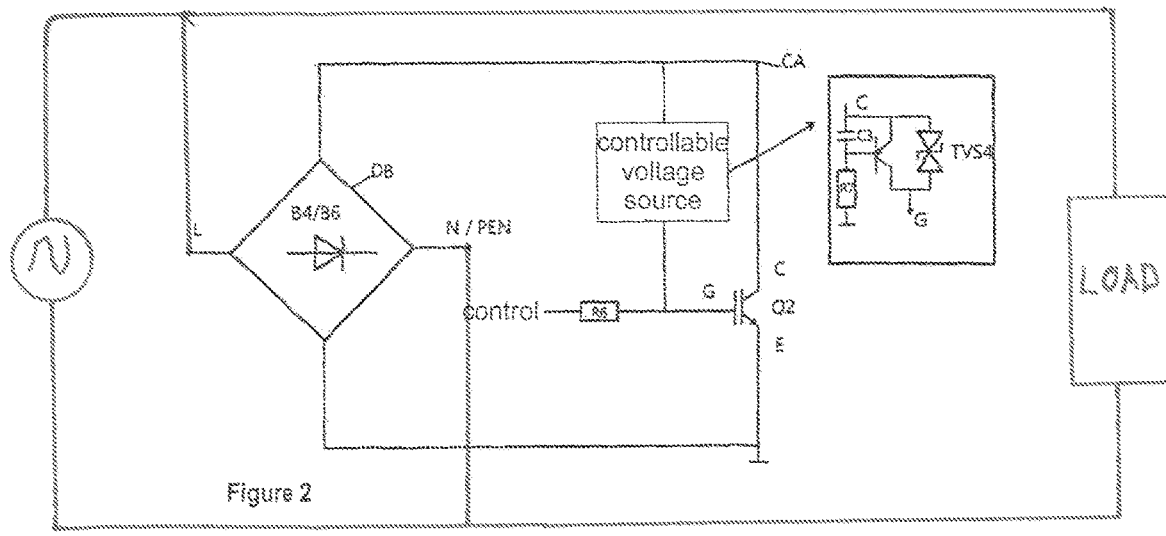
Figure 3:
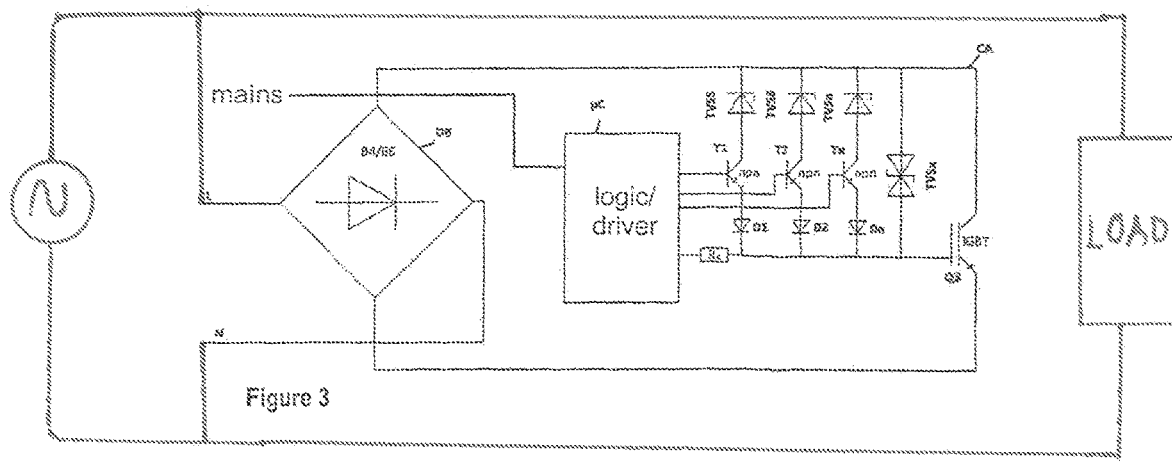
Figure 4:
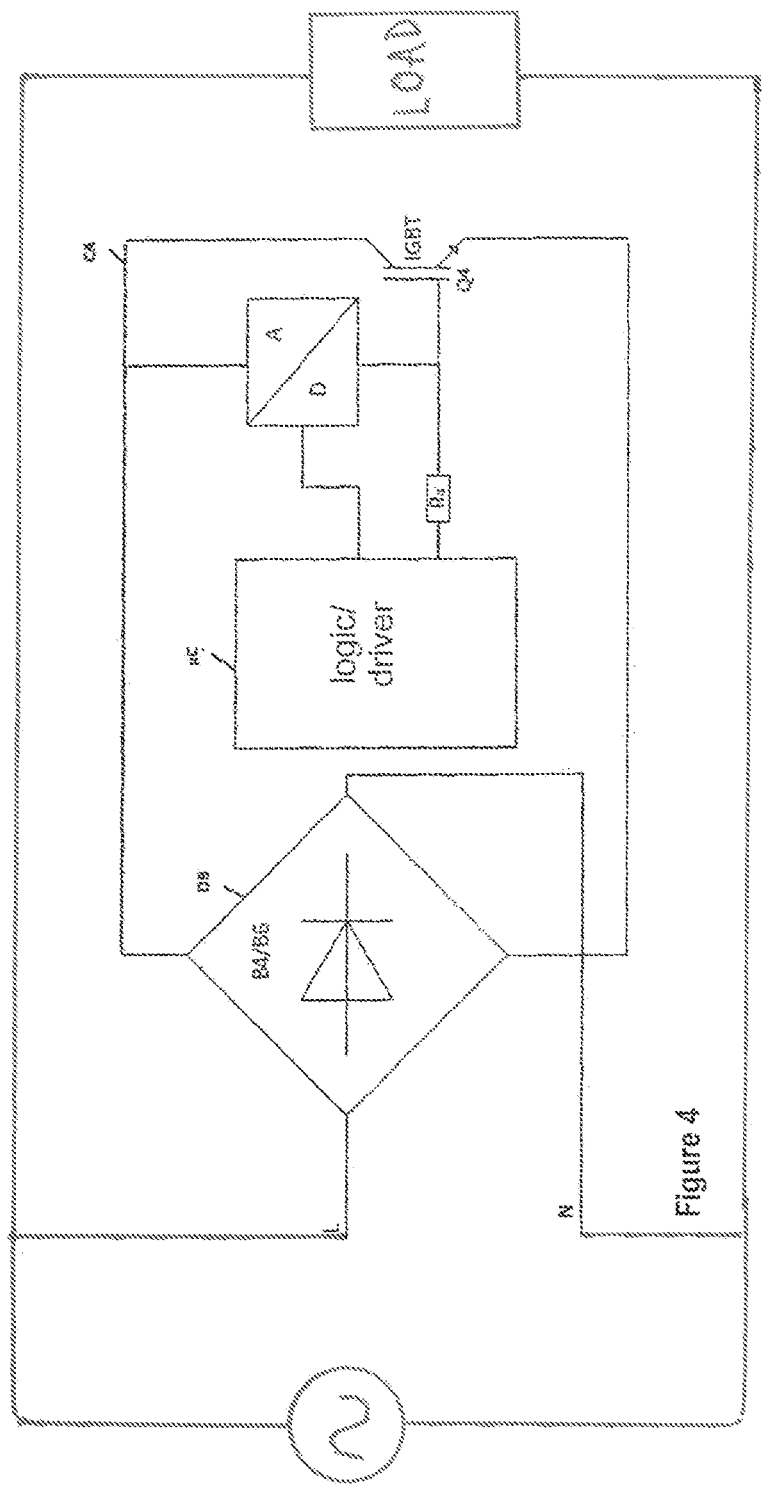

FIG. 1 a schematic diagram of the first embodiment of the invention with a plurality of Zener elements TVS1 to TVSn connected in series in terms of an electronic step circuit;

FIG. 2 a schematic diagram of an embodiment related to the circuit with a linear regulator as a controllable voltage source for setting the protective level;

FIG. 3 a schematic diagram of a circuit assembly according to the third embodiment of the invention, wherein further Zener elements may be connected in parallel to a first Zener element, wherein these further Zener elements may be actuated via a driver unit and thyristor switches are provided in this respect, and FIG. 4 a block diagram of the fourth embodiment of the invention having an active, stepless protective level adaptation using a digital-to-analog converter connected between the gate and collector of the power semiconductor (IGBT) and the digital input thereof being in connection with a microcontroller.

DETAILED DESCRIPTION OF THE INVENTION

In the embodiment according to FIG. 1, the protective circuit comprises a power semiconductor IGBT. A plurality of Zener elements TVS1 to TVSn is provided between the collector and the gate of the IGBT. Circuit means are provided at the junctions of the series connection so as to cause one or more of the Zener elements TVS1 to TVSn to become conducting according to the actual instantaneous value of the supply voltage, in order to thus determine the protective level. In the remaining exemplary embodiments as well, the protective circuit is fed via a diode bridge DB connected to the input L; N so that negative and positive overvoltage pulses may be detected and discharged. In all of the embodiments, the power semiconductor IGBT is also implemented as an active overvoltage protection element.

Consequently, a slope-dependent response occurs, wherein a static protective level adaptation is provided in the embodiment according to FIG. 1.

In the embodiment according to FIG. 2, the protective level is set by a controllable voltage source SQ. The controllable voltage source may be realized preferentially, as shown in the detailed view according to FIG. 2, as a linear regulator the output of which is in connection with the Zener element TVS.

The linear regulator connected between the collector and gate follows the voltage of the network L; N so that the protective level will always be on the level of the supply voltage. Activation of this circuit takes place upon transient voltage changes. A dead time is implemented via the regulator in a targeted manner so as to block signals from being adapted upon transient overvoltages. Rather, current flows toward the gate of the power semiconductor to drive the same.

The representations according to FIGS. 3 and 4 show the option of adapting the protective level to the actual supply voltage by employing an intelligent driver, in particular using a microcontroller μC, by varying the Zener element or the properties thereof respectively. This is possible by the first variant shown in FIG. 3 and the second variant shown in FIG. 4.

In the variant according to FIG. 3, the microcontroller μC determines the instantaneous value of the supply voltage L; N and switches one of the Zener elements TVS1; TVS2; TVSn between the collector and gate of the IGBT. Exemplary protective levels are indicated by the voltage specifications adjacent to the elements TVS1 to TVSn. The switching of the respective elements TVS1 to TVSn is performed by means of transistors T1 to Tn, the basis of which is in each case in connection with the output of the microcontroller μC and a corresponding driver unit that can also be integrated in the microcontroller.

The operation of the representation according to FIG. 3 is as follows.

When the circuit assembly is connected to the network, the protective level is initially preset to the highest maximum value, e.g. 1 kV. After the instantaneous value of the supply voltage has been detected, an appropriate one of the protective levels is actuated via the microcontroller μC and the driver. When an overvoltage event occurs, the surge current will be discharged by means of the IGBT, and thereafter, the protective circuit is preset again to the highest protective level stage. After the overvoltage event, the instantaneous value of the supply voltage is determined again and the protective stage adapted to the supply voltage.

When overvoltage events do not occur and the supply voltage is found to increase slowly, e.g. by 1 V/min, this will be detected by the microcontroller, and the protective level will then be automatically slowly increased or decreased accordingly.

The fourth embodiment as per the representation according to FIG. 4 is based on the idea to connect a digital-to-analog converter DA between the collector and the gate of the IGBT, which in turn is driven by a microcontroller. With this variant, there is the option of setting and adapting a response and adaptation of the protective level exclusively on the basis of the integrated supply voltage.

What is claimed is:

1. A circuit assembly for protecting a unit to be operated from a supply network against surges, comprising an input device having a first and a second input connection (L; N), which are connected to the supply network, and to which the unit to be protected can be connected, and a protective circuit provided between first and the second output connections of the input device in order to limit the voltage applied by the supply network, said protective circuit comprising a power semiconductor (IGBT), and a plurality of Zener elements (TVS1 to TVSn) being connected between the collector and gate of the power semiconductor, each Zener element having a Zener voltage yielding a clamping voltage for the power semiconductor (IGBT), characterized in that the plurality of Zener elements (TVS1 to TVSn) are connected in series, wherein a plurality of circuit means is provided each of which is arranged between a corresponding junction of the connected Zener elements and the gate of the power semiconductor, and the plurality of circuit means is configured such that, depending on the instantaneous value of the voltage of the supply network, a number of the Zener elements entering the conducting state is automatically determined and thus a protective level of the protective circuit is automatically adapted.

2. A circuit assembly according to claim 1, characterized in that the input device is a diode bridge (DB) connected to the supply network, and the protective circuit is fed via the diode bridge (DB) so that negative and positive overvoltage pulses may be discharged.

3. A circuit assembly for protecting a unit to be operated from a supply network against surges, comprising an input device having a first and a second input connection (L; N), which are connected to the supply network, and to which the unit to be protected can be connected, and a protective circuit provided between first and the second output connections of the input device in order to limit the voltage applied by the supply network, said protective circuit comprising a power semiconductor (IGBT), and at least one Zener element (TVS) being connected between the collector and gate of the power semiconductor, the at least one Zener element having a Zener voltage yielding a clamping voltage for the power semiconductor (IGBT), characterized in that the Zener element (TVS) is an integral part of a controllable linear regulator (SQ), which includes a switch configured to automatically operate depending on the instantaneous value of the voltage of the supply network, wherein the controllable linear regulator is connected between the gate and collector of the power semiconductor (IGBT) the output of which is connected to the Zener element (TVS) and following the voltage of the supply network so as to maintain a protective level on the voltage level of the supply voltage.

4. A circuit assembly according to claim 3, characterized in that the input device is a diode bridge (DB) connected to the supply network, and the protective circuit is fed via the diode bridge (DB) so that negative and positive overvoltage pulses may be discharged.

5. A circuit assembly for protecting a unit to be operated from a supply network against surges, comprising an input device having a first and a second input connection (L; N), which are connected to the supply network, and to which the unit to be protected can be connected, and a protective circuit provided between first and the second output connections of the input device in order to limit the voltage applied by the supply network, said protective circuit comprising a power semiconductor (IGBT), and at least one Zener element (TVS) being connected between the collector and gate of the power semiconductor, the at least one Zener element having a Zener voltage yielding a clamping voltage for the power semiconductor (IGBT), characterized in that a group of further Zener elements (TVS1 to TVSn) that can be connected in parallel to the Zener element (TVS) is provided, which can be actuated by a driver unit, wherein the driver unit is in connection with respective inputs of a plurality of transistor switches (T1 to Tn) to which each one of the further Zener elements (TVS1 to TVSn) is respectively associated.

6. A circuit assembly according to claim 5, characterized in that the driver unit is controlled by a microcontroller (µC) which determines the instantaneous value of the voltage of the supply network and actuates respective appropriate transistor switches (T1 to Zn) via the driver unit to adapt a protective level.

7. A circuit assembly according to claim 5, characterized in that the input device is a diode bridge (DB) connected to the supply network, and the protective circuit is fed via the diode bridge (DB) so that negative and positive overvoltage pulses may be discharged.

8. A circuit assembly for protecting a unit to be operated from a supply network against surges, comprising an input device having a first and a second input connection (L; N), which are connected to the supply network, and to which the unit to be protected can be connected, and a protective circuit provided between first and the second output connections of the input device in order to limit the voltage applied by the supply network, said protective circuit comprising a power semiconductor (IGBT), characterized in that between the collector and the gate of the power semiconductor (IGBT), a digital-to-analog converter (DA) is placed, a digital input thereof being in connection with an output of a microcontroller (µC), which at its input side is connected to the supply network, wherein a protective level of the circuit can be defined via an analog output of the digital-to-analog converter (DA).

9. A circuit assembly according to claim 8, characterized in that the input device is a diode bridge (DB) connected to the supply network, and the protective circuit is fed via the diode bridge (DB) so that negative and positive overvoltage pulses may be discharged.

* * * * *